United States Patent
Gonzalez et al.

(10) Patent No.: US 6,171,964 B1
(45) Date of Patent: *Jan. 9, 2001

(54) METHOD OF FORMING A CONDUCTIVE SPACER IN A VIA

(75) Inventors: Fernando Gonzalez; Guy Blalock, both of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/013,633

(22) Filed: Jan. 26, 1998

Related U.S. Application Data

(62) Division of application No. 08/595,806, filed on Feb. 2, 1996.

(51) Int. Cl.[7] .................................................... H01L 23/48
(52) U.S. Cl. ....................... 438/694; 438/695; 438/700; 438/703
(58) Field of Search ..................... 438/694, 695, 438/638, 646, 648, 660, 688, 700, 703

(56) References Cited

U.S. PATENT DOCUMENTS

| | | |
|---|---|---|
| 4,489,481 | 12/1984 | Jones . |
| 4,507,853 * | 4/1985 | McDavid ................... 29/591 |
| 4,720,908 | 1/1988 | Wills . |
| 4,792,842 * | 12/1988 | Honma et al. ............... 357/71 |
| 4,977,106 * | 12/1990 | Smith ......................... 437/192 |
| 5,203,957 * | 4/1993 | Yoo et al. ................... 156/643 |
| 5,243,220 | 9/1993 | Shibata et al. . |
| 5,244,534 | 9/1993 | Yu et al. . |
| 5,269,880 * | 12/1993 | Jolly et al. .................. 156/643 |
| 5,279,990 * | 1/1994 | Sun et al. ................... 437/195 |
| 5,294,836 | 3/1994 | Kishi . |
| 5,312,773 | 5/1994 | Nagashima . |
| 5,358,901 | 10/1994 | Fiordalice et al. . |
| 5,381,040 * | 1/1995 | Sun et al. ................... 257/774 |
| 5,406,122 | 4/1995 | Wong et al. . |
| 5,408,130 * | 4/1995 | Woo et al. .................. 257/758 |
| 5,453,403 | 9/1995 | Meng et al. . |
| 5,534,463 * | 7/1996 | Lee et al. .................... 437/195 |
| 5,619,072 | 4/1997 | Mehta . |
| 5,691,571 | 11/1997 | Hirose et al. . |
| 5,719,446 | 2/1998 | Taguchi et al. . |

* cited by examiner

Primary Examiner—Benjamin L. Utech
Assistant Examiner—Matthew Anderson
(74) Attorney, Agent, or Firm—Kirkpatrick & Lockhart LLP

(57) ABSTRACT

A method of constructing a conductive via spacer within a dielectric layer located between a first metal layer and a second metal layer includes the steps of depositing a conductive spacer layer within the opening and over the first metal layer. A portion of the conductive spacer layer is removed to leave a conductive spacer within the opening. The second metal layer is deposited over the spacer to complete the connection between the first and second metal layers. The spacer preferably comprises a material selected from the group comprising refractory metal silicides and nitrides. The spacer is preferably tapered and the via may include a glue layer to improve the adherence of the spacer to the dielectric layer.

17 Claims, 5 Drawing Sheets

METHOD OF FORMING A CONDUCTIVE SPACER IN A VIA

This a divisional of U.S. patent application Ser. No. 08/595,806 filed on Feb. 2, 1996.

BACKGROUND OF THE INVENTION

1. Field of the Invention

The present invention is directed generally to a via containing a spacer and a method of making the via, and, more particularly, to a via containing a conductive spacer.

2. Description of the Background

It is well known in the semiconductor art to use interconnect structures, known as vias and contacts, to connect an upper conductor of current, such as metal or polysilicon, through a dielectric layer to a lower conductor of current. A via is an electrical connection between two metal layers, and a contact, in contrast, is an electrical connection between anything other than two metal layers, such as between metal and silicon. Vias and contacts are used extensively in very large scale integrated ("VLSI") circuits, and an average VLSI circuit may contain 16 million vias and contacts.

Vias and contacts are formed by an opening in a dielectric layer and a conductor within the opening. Directional deposition methods, such as evaporation and sputtering, are often used to deposit the conductor within the opening. Such methods, however, often provide poor step coverage and only a thin conductive layer on the vertical wall of the opening. Thin layers are often not sufficient to provide good electrical contact between the upper and lower conductors, and result in a high resistance and a propensity for electromigration failures.

Although non-directional deposition methods, such as chemical vapor deposition, provide good coverage of vertical walls, those methods do not provide satisfactory results with the conductors which are preferably used in vias and contacts, such as aluminum.

It is well known that step coverage can be greatly improved in directional deposition methods by tapering the wall of a via or contact, so that the wall is not substantially vertical and the diameter at the top is greater than the diameter at the bottom.

One approach to taper a wall is by sputtering or etching the walls of the opening, as disclosed, for example, in U.S. Pat. No. 5,269,880, issued to Jolly et al. That approach, however, often requires additional process steps to provide the bottom of the opening with a protective layer prior to sputtering or etching, and then removing the protective layer following sputtering or etching, as disclosed in the Jolly et al patent.

An alternative approach is to taper the walls by providing a spacer within the via or contact, without disturbing the dielectric layer and without the need for a protective layer to protect the bottom of the opening. An example of such a method is disclosed in U.S. Pat. No. 4,489,481, issued to Jones. Spacers are typically used in critical geometries where dimensions, such as the size of the opening, must be precisely controlled.

Dielectric materials have traditionally been used as spacers, as disclosed in the Jones patent. Oxides, for example, have a smooth surface which allows more precise control of their dimensions. Metals, in contrast, have a "grainy" structure which results in a rough surface. The rough surface, in turn, makes it difficult to precisely control the dimensions of a metal structure. As a result, it was believed that metals were not suited for use in critical geometries, such as spacers, and so the use of metal as a spacer has generally been ignored.

In addition, vias and contacts are typically formed in oxide layers, and while oxide spacers adhere very well to the oxide layer, many metals do not, and thus require an intermediate "glue" layer, such as polysilicon, which adheres well to both oxide and the metal.

Spacers made of a dielectric, however, have the undesirable property of being an insulator. As a result, the use of a dielectric spacer narrows the contact area between the conductor in a via or contact and the upper or lower conductor, resulting in increased resistance. Furthermore, when a dielectric spacer is etched, it leaves dielectric material in the bottom of the opening, which further increases the resistance of the via or contact, or alternatively, requires additional process steps to remove the dielectric material.

Those problems are exaggerated as the density of integrated circuits increases and the size of openings decreases. As the diameter of an opening approaches one micron, the aspect ratio approaches 1 to 1, and directional deposition methods, even when used in conjunction with tapered sidewalls or dielectric spacers, do not provide a reliable electric contact. In those situations, to reliably obtain good electrical contact the opening is usually completely filled with a conductor, known as a "plug". Plugs, however, are time consuming to produce, and they require several additional process steps. Furthermore, shadowing effects during the formation of plugs often limit their effectiveness as a good electrical connection. As a result, the use of plugs is not always a desirable option.

U.S. Pat. No. 4,507,853, issued to McDavid, discloses the use of metal spacers in a contact between a metal layer and a silicon substrate. There is no disclosure in the McDavid patent, however, of a method of forming a metal spacer in a via. The method disclosed in the McDavid patent does not address the problems present in forming a metal spacer in a via. For example, one problem with forming a metal spacer in a via, which is not addressed in the McDavid patent, is determining when to stop the etch process used to form a spacer from a metal layer deposited in an opening. In the process disclosed in the McDavid patent, a silicon substrate acts as an etchstop. When forming a metal spacer in a via, however, a process that etches the metal layer used to form the spacer will also etch an underlying metal layer. The etch process, therefore, must be stopped before it reaches the underlying metal layer. In an extreme case, the etch process can destroy the underlying metal layer. In a less extreme case, the surface of the underlying metal layer will be recessed by the etch process, increasing both the effective depth and the aspect ratio of the opening, making it more difficult for a subsequent metal layer to make contact with the underlying metal layer. In contrast, if the etch process is stopped too soon, the removal of the conductive layer will not be effective, and a thin film of conductor will remain where it is not wanted.

Thus, the need exists for via spacer with improved electromigration properties, with improved metal step coverage, and with reduced resistance, thereby allowing the use of smaller vias and more dense semiconductor devices.

SUMMARY OF THE INVENTION

The present invention is directed generally to a via spacer and a method of making the same. The via spacer is formed within an opening in a dielectric layer between a first and a second metal layer. The invention includes the step of depositing a spacer layer within the opening of the via so that the spacer layer is in contact with the first metal layer. The invention also includes the step of removing a portion of the space layer to leave a spacer within the opening, with a portion of the spacer covering the first metal layer. The second metal layer is deposited over the spacer to complete the connection between the first and second metal layers.

The spacer preferably comprises a material selected from the group comprising refractory metal silicides or their associated nitrides, such as, for example, titanium silicide, titanium nitride, and cobalt silicide. The spacer is preferably tapered and the via may include a glue layer to improve the adherence of the spacer to the dielectric layer.

The invention solves the above-mentioned shortcomings in the prior art by providing a method of forming a conductive spacer, which provides for good step coverage and which does not decrease the contact area of the via.

BRIEF DESCRIPTION OF THE DRAWINGS

For the present invention to be clearly understood and readily practiced, the present invention will be described in conjunction with the following figures, wherein.

DESCRIPTION OF THE PREFERRED EMBODIMENTS

It is to be understood that the figures have been simplified to illustrate only those aspects of a via which are relevant, and some of the dimensions have been exaggerated to convey a clear understanding of the present invention, while eliminating, for the purpose of clarity, some elements normally found in a via. Those of ordinary skill in the art will recognize that other elements and process steps are required to produce an operational via. However, because such elements and process steps are well known in the art, and because they do not further aid in the understanding of the present invention, a discussion of such elements is not provided herein.

Figure 1:
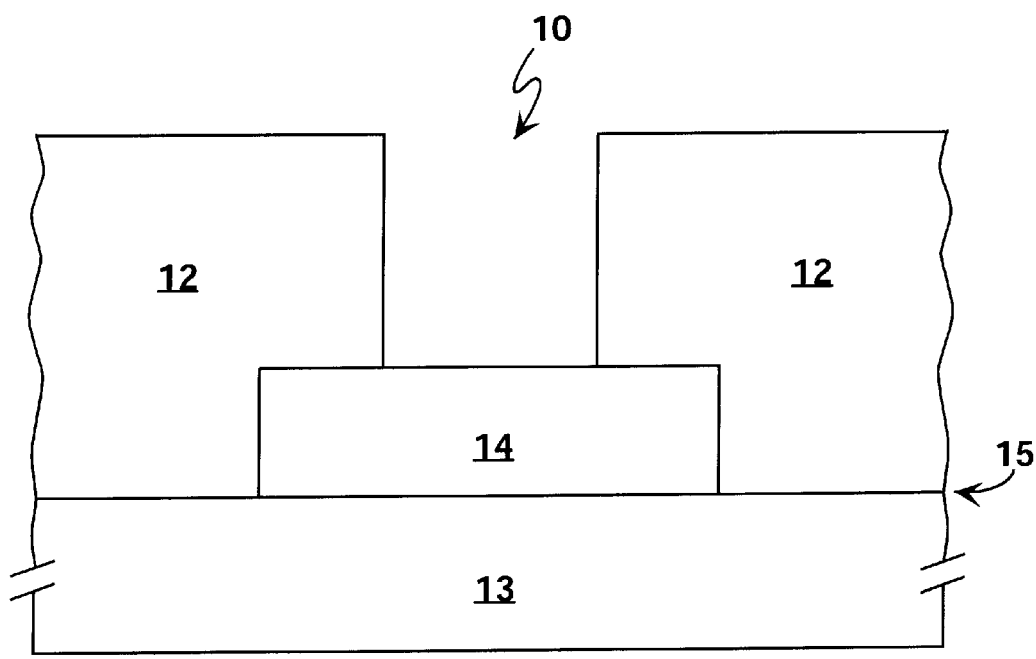
FIGS. 1, 2, 4, and 5 are cross-sectional views of a via of an integrated circuit at successive steps in a method of fabricating a via spacer according to the present invention.

FIG. 1 shows an opening 10 formed in a dielectric layer 12, such as silicon dioxide. The construction of openings 10 is well known, and may be accomplished, for example, by an anisotropic etch using $CF_4+CHF_3$ in a reactive ion etch ("RIE") reactor, at between 10° C. and 40° C. Below the dielectric layer 12 is a silicon substrate layer 13 and a first metal layer 14, such as aluminum, which defines the bottom of the opening 10. The metal layer 14 is patterned to form conductors as is known. The top of the silicon substrate layer 13 and the bottoms of the dielectric layer 12 and first metal layer 14 are separated by an interface 15.

Figure 2:
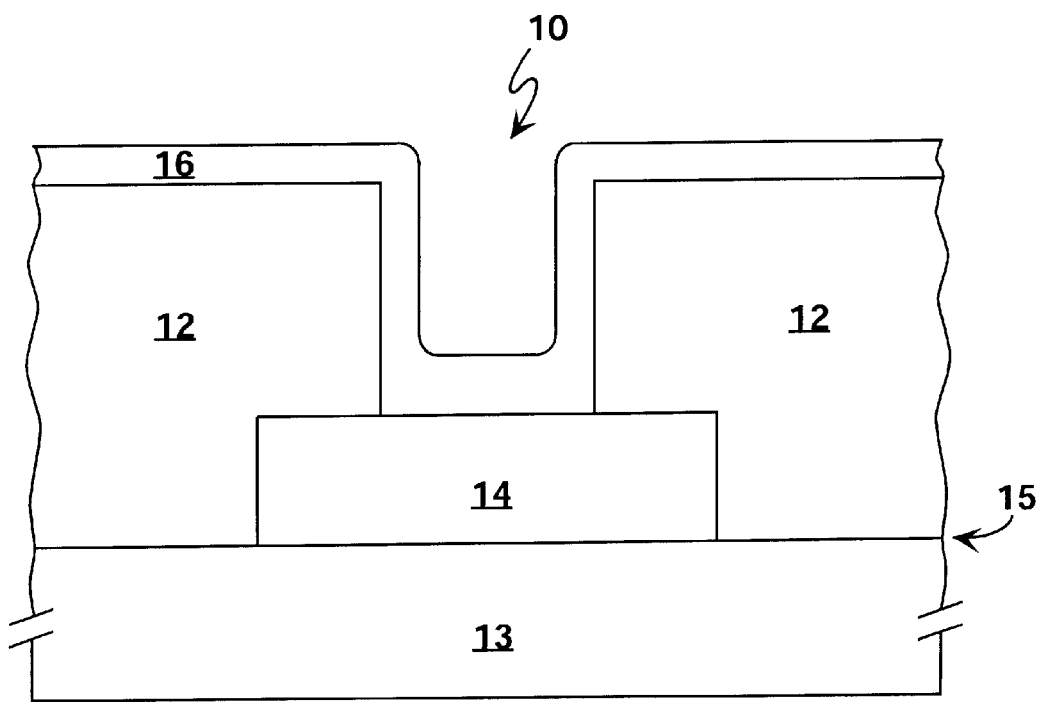

FIG. 2 shows the structure of FIG. 1 after the application of a conductive spacer layer 16. In the preferred embodiment, the spacer layer 16 is titanium. Titanium is resistant to electromigration, has good "glue" properties with respect to the preferred dielectric material, and has good conduction properties. Although any metal will work as a spacer, refractory metals, such as titanium silicide, titanium nitride and cobalt silicide, are preferred because of their superior glue and electromigration qualities. The spacer layer 16 preferably has a thickness of between approximately ten percent to forty percent of the opening's diameter, and may be applied using a chemical vapor deposition ("CVD") process, preferably using a titanium-chloride chemistry, such as titanium and $CFCl_3$.

Alternatively, titanium may be sputtered directly onto the dielectric layer 12 and the opening 10. Because sputtered titanium may result in shadowing, a columniator may be utilized to provide a more uniform distribution of the spacer layer 16, in particular with respect to the walls and the bottom of the opening 10.

Another preferred material for the spacer layer 16 is titanium silicide, $TiSi_x$, deposited by a CVD process. Titanium silicide CVD produces a conformal layer of titanium silicide, yielding uniform metal layers along the vertical and horizontal surfaces in and around the opening 10. The titanium silicide CVD process uses titanium tetrachloride, $TiCl_4$, in conjunction with silan, DCS, or some other source of silicon in the gas molecule.

Figure 3:
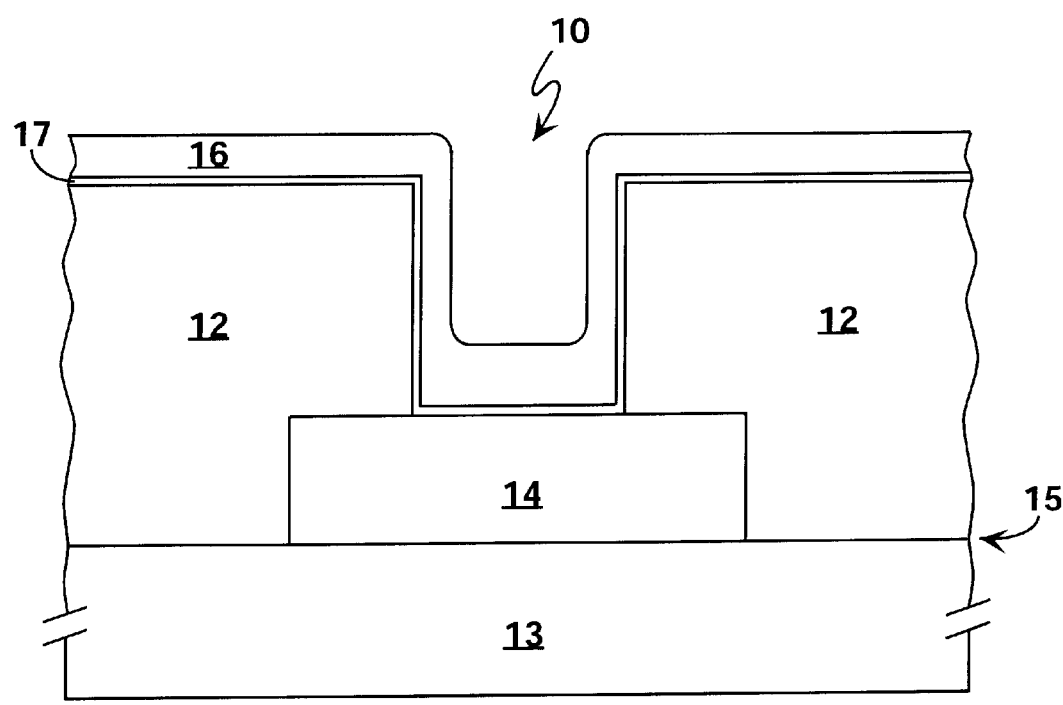
FIGS. 3 illustrates an alternative embodiment of a via constructed according to the teachings of the present invention.
Figure 4:
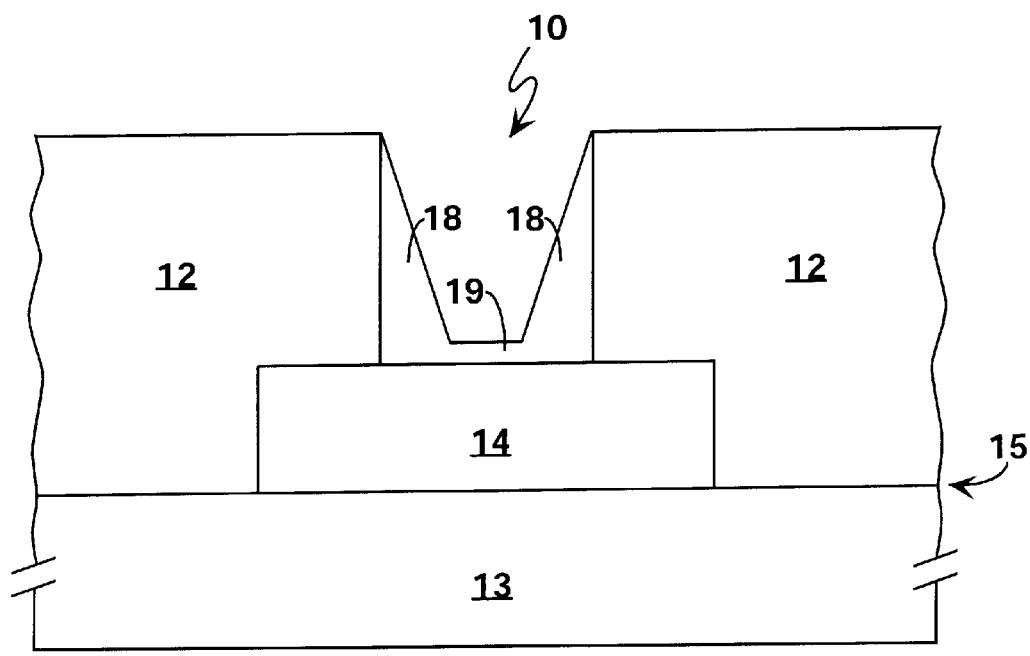

FIG. 3 shows an alternative embodiment in which a "glue" layer 17 is used. The glue layer 17 may be used, for example, when tungsten is the spacer layer 16, because tungsten does not adhere well to oxides. As a result, one or more glue layers 17 are used to firmly attach the tungsten to the dielectric layer 12. A preferred glue layer 17 is titanium, which helps to reduce contact resistance by consuming silicon dioxide that might remain on top of the first metal layer 14. Another preferred glue layer 17 is titanium nitride, which is much more conformal and easier to deposit in the opening 10 than titanium, but which does not consume silicon dioxide. Polysilicon also works well as a glue layer 17, but has q higher resistance than titanium and titanium nitride FIG.4 shows the opening 10 after the spacer layer 16 has been etched, leaving a spacer 18. The spacer 18 is tapered, resulting in the opening 10 being wider at the top than at the bottom. The etch is preferably an anisotropic etch performed, for example, using a chlorine-based gas, such as $Cl_2$, $CCl_4$, or HCl, which is an effective etch for titanium. The etch may also use $BCl_3$, $SiCl_4$, and $Cl_2$, which is an effective etch for aluminum, titanium nitride, titanium silicide, and polysilicon.

The anisotropic etch removes the spacer layer 16 from horizontal surfaces. The etch also removes material more quickly from the top of the dielectric layer 12 than from the bottom of the opening 10, so that when the spacer layer 16 has been removed from the top of the dielectric layer 12, there is still a thin spacer layer 19 remaining on the bottom of the opening 10 and over the first metal layer 14. As a result, the spacer layer 16 can be removed from the dielectric layer 12, and damage to the first metal layer 14 can be avoided, by using the removal of the spacer layer 16 from the dielectric layer 12 as a limiting factor. For example, the time required to etch the spacer layer 16 from the dielectric layer 12 can be calculated, given the material of the spacer layer 16, the thickness of the spacer layer 16, and the etch chemistry used. Alternatively, a spectrum analyzer may be used to sense the presence of the dielectric material, such as silicon dioxide, which is indicative that the spacer layer 16 has been removed from the top of the dielectric layer 12, and the dielectric layer 12 is being etched. Those processes will have a margin of error created by the spacer layer 19 remaining at the bottom of the opening 10 after the spacer layer 16 has been removed from the dielectric layer 12.

Since the spacer layer 19 in the bottom of the opening 10 is a conductor, its presence is not detrimental to obtaining a good electrical contact. In fact, the titanium spacer layer 19 cleans the first metal layer 14 and decreases the contact resistance by consuming silicon dioxide which may be present at the bottom of the opening 10. As a result, it is preferable to have at least a small titanium layer 19 remaining in the bottom of the opening 10.

Figure 5:
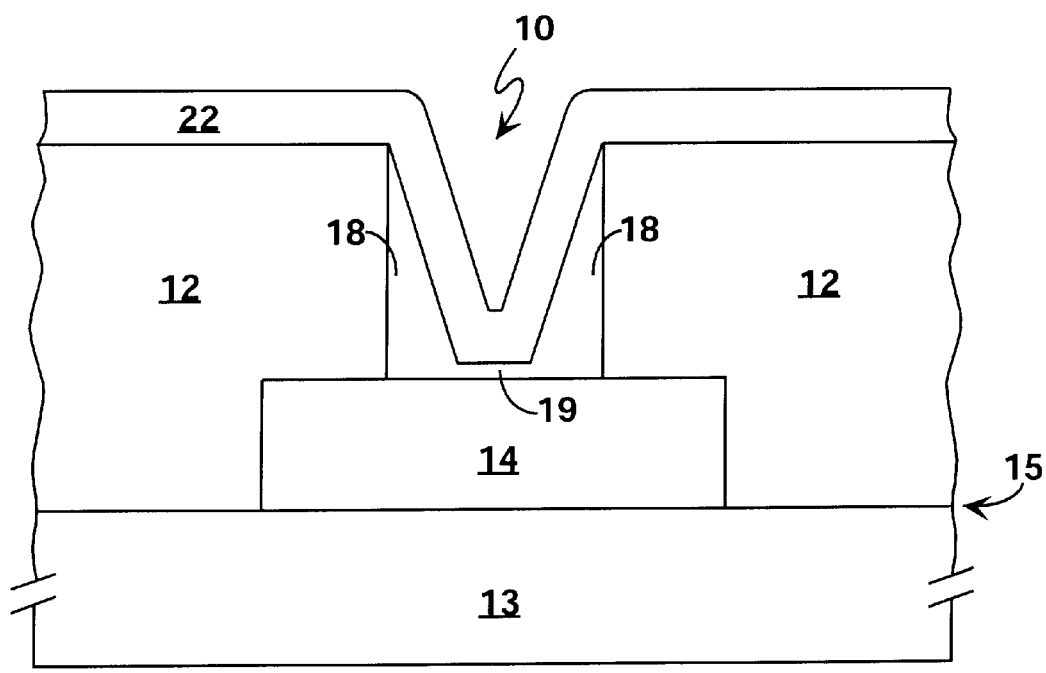

FIG. 5 shows the via after a second metal layer 22 is deposited over the spacer 18. The second metal layer 22 is preferably aluminum deposited by a sputtering process, as is well known in the prior art. Other materials, of course, may be used for the second metal layer 22, such as copper, titanium, tungsten, and various alloys, and they may be deposited in any manner, such as by sputtering and CVD. The second metal layer 22 will also be patterned to form discrete conductors (not shown).

Figure 6:
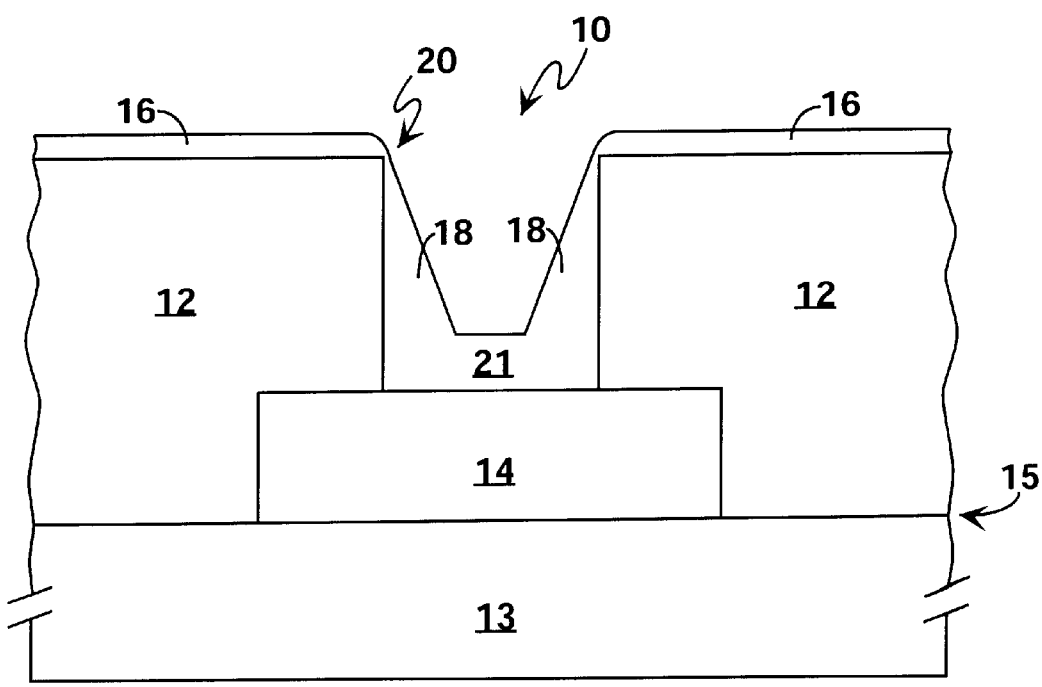
FIGS. 6 and 7 illustrate another embodiment of a via constructed according to the teachings of the present invention.

FIG. 6 shows an alternative process wherein the spacer 18 is formed by sputter etching the spacer layer 16, resulting in tapered corners 20 and additional spacer material at the bottom of the opening 10, forming a partial plug 21. The partial plug 21 has a thickness that is between ten percent and forty percent of the via's depth, and effectively reduces the depth of the opening 10 and the aspect ratio. The combination of a metal spacer 18 and a partial plug 21 greatly increase the step coverage in the opening 10. The angle of the sputter etch is preferably between 30 and 60 degrees above horizontal, and preferably uses an argon plasma. The sputtering may leave a portion of the spacer layer 16 on top of the dielectric layer 12, which may be removed immediately by, for example, the same methods discussed above with respect FIG. 4. Preferably, however, the spacer layer 16 is removed at a later time, as discussed below with respect to FIG. 7.

Figure 7:
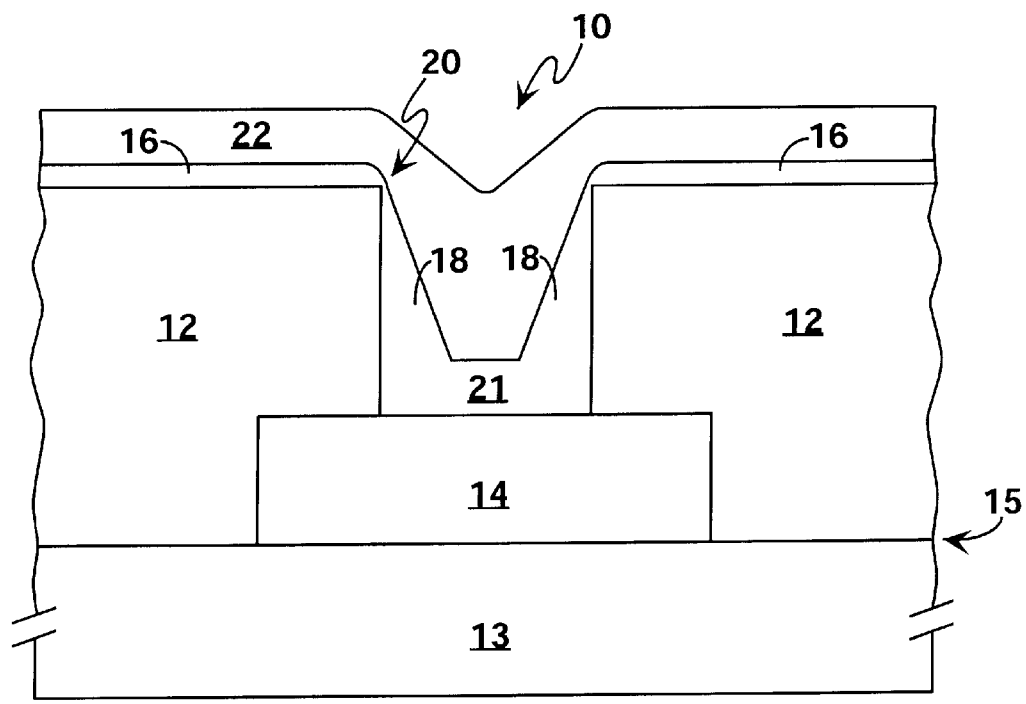

FIG. 7 shows a second metal layer 22 deposited on the alternative embodiment shown in FIG. 6. The second metal layer 22 exhibits good step coverage over the spacer 18 and partial plug 21. The second metal layer 22 covers the spacer 18, the partial plug 21, and the spacer layer 16 on top of the dielectric layer 12. Both the second metal layer 22 and the spacer layer 16 are removed at the same time by, for example, the process discussed above with respect to FIG. 4 for removing the spacer layer 16.

As seen in FIGS. 5 and 7, a via constructed according to the present invention has excellent step coverage. In addition, the use of a metal spacer 18 acts as a conductor reducing the resistance of the via. Furthermore, because the spacer 18 is a conductor, its dimensions do not need to be precisely controlled within the opening 10. In fact, superior results are achieved if, as in the preferred embodiment, the spacer partially or completely covers the first metal layer 14. Those features allow the via 10 to be smaller, while still providing good electrical contact and reduced risk of electromigration failure.

Figure 8:
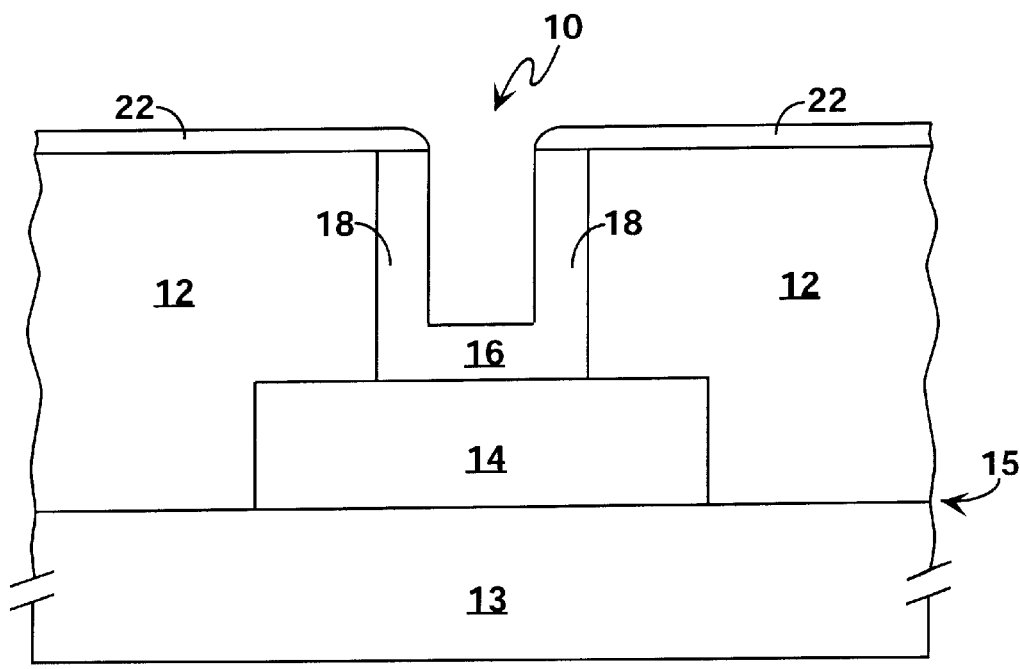
FIG. 8 illustrates another embodiment of a via constructed according to the teachings of the present invention.

FIG. 8 shows another alternative embodiment of the present invention. Because the spacer 18 is a conductor, step coverage of the second metal layer 22 is not required, and so the spacer 18 does not need to be tapered. Furthermore, since step coverage is not required, the second metal layer 22 may be made thinner, and must only make good contact with the spacer 18. The conductive spacer 18 forms a ring in the opening 10, and alone is a sufficient conductor between the first and second metal layers 14 and 22.

Figure 9:
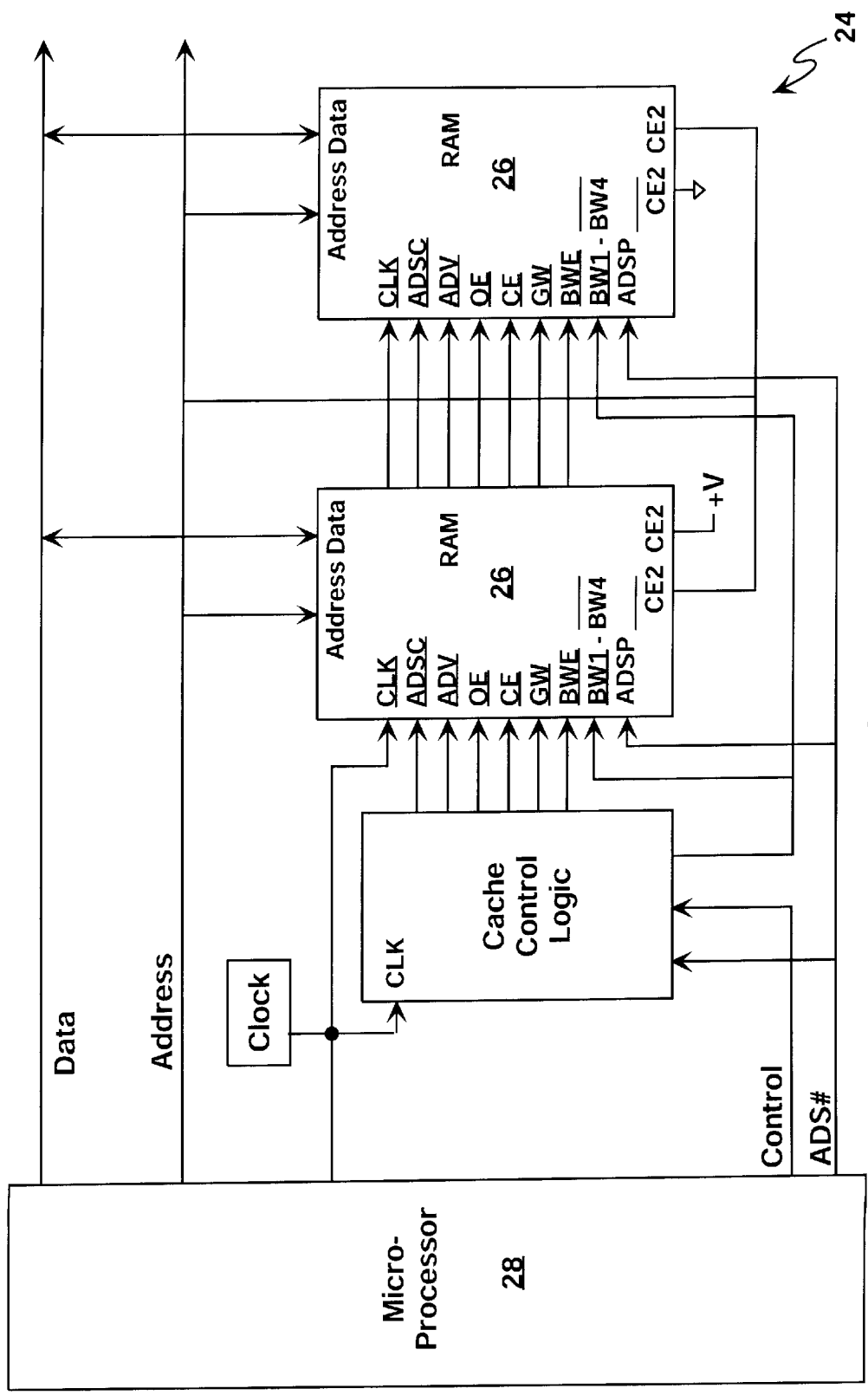
FIG. 9 illustrates a system in which the present invention may be used.

FIG. 9 illustrates a system 24 in which the present invention may be employed. The system is comprised of a solid state device, such as a memory device 26, on which connections of the type disclosed herein are made The memory device 26 is under the control of a microprocessor 28 which may be programmed to carry out particular functions as is known in the art.

Those with ordinary skill in the art will recognize that many modifications and variations of the present invention may be implemented. The foregoing description and the following claims are intended to cover all such modifications and variations.

What is claimed is:

1. A method of forming a via carried within an opening in a dielectric layer, wherein the opening extends between a first metal layer and a top surface of the dielectric layer, wherein the top surface of the dielectric layer is subsequently covered by a second metal layer, comprising the steps of:

depositing a spacer layer using titanium and $CFCl_3$ in a chemical vapor deposition process within the opening and in contact with the first metal layer; and removing a portion of said spacer layer to leave a spacer within the opening, with a portion of said spacer covering the first metal layer.

2. The method of claim 1, wherein the step of removing comprises the step of removing a portion of the spacer layer to leave a tapered spacer within the opening.

3. The method of claim 1, additionally comprising the step of depositing a glue layer within the opening before the step of depositing a spacer layer within the opening.

4. The method of claim 1, wherein the step of depositing a spacer layer comprises the step of depositing a spacer layer having a thickness of between approximately ten percent and forty percent of the opening's diameter.

5. The method of claim 1, wherein the step of removing comprises the step of sputtering the spacer layer with an argon plasma.

6. The method of claim 1, wherein the step of removing comprises the step of removing a portion of the spacer layer with an anisotropic etch.

7. The method of claim 1, wherein the step of removing comprises the step applying an anisotropic etch using a chlorine-based gas.

8. The method of claim 7, wherein the step of removing comprises the step of applying an anisotropic etch using a chlorine-based gas selected from the group comprising: $Cl_2$, $CCl_4$, HCl, $BCl_3$, and $SiCl_4$.

9. The method of claim 1, wherein the step of removing comprises the step of removing a portion of the spacer layer with a sputter etch using a directional plasma.

10. The method of claim 1, wherein the step of removing comprises the step of removing a portion of the spacer layer with a sputter etch using an argon plasma.

11. The method of claim 1, wherein the step of removing comprises the step of removing a portion of the spacer layer to leave a spacer and a partial plug in the opening.

12. The method of claim 1, wherein the step of removing comprises the step of removing a portion of the spacer layer, leaving a spacer in said opening, and leaving a partial plug having a thickness of between approximately ten and forty percent of the opening's depth.

13. The method of claim 1, wherein the step of removing comprises the step of removing a portion of the spacer layer using a spectrum analyzer to monitor the removing.

14. The method of claim 1, additionally comprising the step of depositing at least two glue layers within the opening before the step of depositing a spacer layer within the opening.

15. The method of claim 3, wherein the step of depositing a glue layer includes the step of depositing a layer of titanium nitride within the opening.

16. The method of claim 3, wherein the step of depositing a glue layer includes the step of depositing a layer of polysilicon within the opening.

17. The method of claim 9, wherein the angle of the sputter etch is between 30 and 60 degrees above horizontal.

\* \* \* \* \*

UNITED STATES PATENT AND TRADEMARK OFFICE
CERTIFICATE OF CORRECTION

PATENT NO. : 6,171,964 B1
DATED : January 9, 2001
INVENTOR(S) : Gonzalez et al.

Page 1 of 1

It is certified that error appears in the above-identified patent and that said Letters Patent is hereby corrected as shown below:

<u>Column 3,</u>
Line 4, immediately after the words "of the", please delete the word "space" and insert the word -- spacer -- therefor.

<u>Column 4,</u>
Line 34, immediately after the words "but has", please delete the letter "q" and insert the article -- a -- therefor.

Signed and Sealed this

Twenty-seventh Day of November, 2001

Attest:

Nicholas P. Godici

NICHOLAS P. GODICI